US012388059B2

(12) United States Patent
Zhang et al.

(10) Patent No.: US 12,388,059 B2
(45) Date of Patent: Aug. 12, 2025

(54) CHIP PACKAGE STRUCTURE AND CHIP PACKAGING METHOD

(71) Applicant: Huawei Technologies Co., Ltd., Shenzhen (CN)

(72) Inventors: Tonglong Zhang, Shenzhen (CN); Xiaodong Zhang, Shenzhen (CN); Yong Guan, Shanghai (CN); Heng Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 802 days.

(21) Appl. No.: 17/531,133

(22) Filed: Nov. 19, 2021

(65) Prior Publication Data

US 2022/0077123 A1  Mar. 10, 2022

Related U.S. Application Data

(63) Continuation of application No. PCT/CN2019/087659, filed on May 20, 2019.

(51) Int. Cl.

| | | |
|---|---|---|
| *H01L 25/04* | (2023.01) | |
| *H01L 21/56* | (2006.01) | |
| *H01L 23/00* | (2006.01) | |
| *H01L 23/29* | (2006.01) | |
| *H01L 23/538* | (2006.01) | |
| *H01L 25/00* | (2006.01) | |
| *H01L 25/10* | (2006.01) | |

(52) U.S. Cl.
CPC .......... *H01L 25/105* (2013.01); *H01L 21/568* (2013.01); *H01L 23/29* (2013.01); *H01L 23/5386* (2013.01); *H01L 24/16* (2013.01); *H01L 24/73* (2013.01); *H01L 25/50* (2013.01); *H01L 2224/16145* (2013.01); *H01L 2224/16227* (2013.01); *H01L 2224/73204* (2013.01)

(58) Field of Classification Search
CPC ..... H01L 25/105; H01L 21/568; H01L 23/29; H01L 25/043
See application file for complete search history.

(56) References Cited

U.S. PATENT DOCUMENTS

| | | |
|---|---|---|
| 2011/0068427 A1 | 3/2011 | Paek et al. |
| 2011/0285007 A1 | 11/2011 | Chi et al. |
| 2013/0203215 A1 | 8/2013 | Hung et al. |

(Continued)

FOREIGN PATENT DOCUMENTS

| | | |
|---|---|---|
| CN | 2636411 Y | 8/2004 |
| CN | 103890940 A | 6/2014 |

(Continued)

*Primary Examiner* — Errol V Fernandes
(74) *Attorney, Agent, or Firm* — Conley Rose, P.C.

(57) ABSTRACT

A chip package structure includes a first chip, a second chip, and a carrier board. The first chip is disposed between the second chip and the carrier board. An active layer of the first chip is opposite to an active layer of the second chip. A first interconnection structure is disposed between the first chip and the second chip and is configured to couple the active layer of the first chip to the active layer of the second chip. A first conductor pillar is disposed in the first chip. One end of the first conductor pillar is coupled to the active layer of the first chip, and the other end of the first conductor passes through the first chip to be coupled to a circuit in the carrier board.

20 Claims, 12 Drawing Sheets

(56) References Cited

U.S. PATENT DOCUMENTS

| | | |
|---|---|---|
| 2013/0241057 A1 | 9/2013 | Yu et al. |
| 2015/0001685 A1 | 1/2015 | Chung et al. |
| 2017/0005027 A1 | 1/2017 | Yu et al. |
| 2017/0207197 A1 | 7/2017 | Yu et al. |
| 2017/0287874 A1* | 10/2017 | Fang ................ H01L 24/11 |
| 2017/0365580 A1 | 12/2017 | Shih et al. |
| 2018/0076179 A1 | 3/2018 | Hsu et al. |
| 2019/0035767 A1 | 1/2019 | Yu et al. |

FOREIGN PATENT DOCUMENTS

| | | |
|---|---|---|
| CN | 104143526 A | 11/2014 |
| CN | 104253056 A | 12/2014 |
| CN | 105374793 A | 3/2016 |
| CN | 107731761 A | 2/2018 |
| CN | 107808878 A | 3/2018 |
| CN | 109309074 A | 2/2019 |
| DE | 102018116750 A1 | 4/2019 |
| DE | 102018102086 A1 | 5/2019 |
| EP | 3007225 A1 | 4/2016 |

\* cited by examiner

S02: Provide a carrier sheet 600, at least one first chip 11/12, and a second chip 20, where at least one first conductor pillar 103 is disposed in the first chip 11/12

S04: Bond a rear face of the second chip 20 to the carrier sheet 600, where the rear face of the second chip 20 is a surface that is of the second chip 20 and that is away from an active layer 201 of the second chip 20

S06: Connect an active layer 101 of the first chip 11/12 to the active layer 201 of the second chip 20 by using a first interconnection structure 102

S08: Form a plastic packaging layer 40 on the carrier sheet 600, the second chip 20, and the first chip 11/12, and remove a part of the plastic packaging layer 40, to expose an end face that is of the first conductor pillar 103 and that is away from the second chip 20

S10: Connect a carrier board 30 to the end face that is of the first conductor pillar 103 and that is away from the first chip 10

S12: Remove the carrier sheet 600, to obtain a chip package structure

FIG. 8

CHIP PACKAGE STRUCTURE AND CHIP PACKAGING METHOD

CROSS-REFERENCE TO RELATED APPLICATIONS

This is a continuation of International Patent Application No. PCT/CN2019/087659 filed on May 20, 2019, which is hereby incorporated by reference in its entirety.

TECHNICAL FIELD

This application relates to the field of chip packaging technologies, and in particular, to a chip package structure and a chip packaging method.

BACKGROUND

As people require more about a multi-function, high-storage, and high-rate electronic device, a chip such as an application processor (AP) chip has a higher integration degree and a larger size. However, the larger size of the chip indicates greater stress, a higher warpage risk, the higher costs, and a lower yield. Generally, many function modules such as a storage module are integrated into the AP chip. In addition, as a user has a higher bandwidth requirement and a higher storage requirement for the chip, an area occupation proportion of the storage module becomes increasingly large, thereby increasing an area of the AP chip.

It is gradually agreed in the industry that some of the function modules (such as the storage module) in the AP chip are separated to form a separate chip, and then the chip is interconnected to the AP chip to form a package body. In this way, an occupation proportion of the storage module in the AP chip may be reduced, to avoid an excessively large size of the AP chip. In addition, a size of the separated storage module is no longer limited by the AP chip. The storage module may have a larger size to meet a requirement for a high-storage and high-rate electronic device. Therefore, a multi-chip packaging technology is urgently needed.

In an existing chip packaging technical solution, as shown in FIG. 1, generally, two chips (a chip 1 and a chip 2) are electrically connected to a redistribution layer by using copper pillars. Signal transmission between the two chips is implemented by using the copper pillars and the redistribution layer. However, efficiency of the signal transmission is low because the signal transmission between the two chips needs to pass through a relatively long line.

SUMMARY

The present disclosure provides a chip package structure and a chip packaging method, to overcome a technical problem that efficiency of signal transmission is low because the signal transmission between two chips needs to pass through a relatively long line.

According to a first aspect, an embodiment of this application provides a chip package structure, including at least one first chip, a second chip, and a carrier board. The first chip is disposed between the second chip and the carrier board. An active layer of the first chip is opposite to an active layer of the second chip. A first interconnection structure is disposed between the first chip and the second chip and is configured to connect the active layer of the first chip to the active layer of the second chip. A first conductor pillar is disposed in the first chip. One end of the first conductor pillar is connected to the active layer of the first chip, and the other end of the first conductor pillar passes through the first chip to be connected to a circuit in the carrier board.

It should be understood that, in this embodiment of this application, the carrier board may be a redistribution layer (for example, a second redistribution layer in the embodiments of this application), a printed circuit board (PCB), a circuit board, a chip, a chip package structure, or the like. This is not limited in this embodiment of this application.

In the chip package structure, an internal circuit of the first chip is connected to the circuit in the carrier board by using the first conductor pillar disposed in the first chip, and an internal circuit of the second chip is connected to the circuit in the carrier board by using a second conductor pillar disposed in the active layer of the second chip. The active layers of the two chips (that is, the first chip and the second chip) are connected face-to-face, to shorten a line of signal transmission between the two chips and improve efficiency of the signal transmission between the two chips.

In a possible implementation of this embodiment of this application, the chip package structure further includes a second conductor pillar. One end of the second conductor pillar is connected to the active layer of the second chip, and the other end of the second conductor pillar is connected to the circuit in the carrier board.

In a possible implementation of this embodiment of this application, a dielectric layer is disposed on a surface that is of the first chip and that is away from the second chip (that is, a rear face of the first chip). The first conductor pillar passes through the dielectric layer to be electrically connected to the carrier board.

It should be understood that the rear face of the first chip is a surface that is of the first chip and that is away from the active layer of the first chip.

The dielectric layer may be used to avoid simultaneous grinding on the first conductor pillar and a semiconductor material of the first chip in a grinding process. Therefore, the following case can be avoided. A conductive particle in the first conductor pillar contaminates the semiconductor material of the first chip, to improve electrical performance of the chip.

In a possible implementation of this embodiment of this application, the chip package structure further includes a plastic packaging layer disposed between the carrier board and the second chip. The first conductor pillar passes through the plastic packaging layer, and the second conductor pillar passes through the plastic packaging layer.

The plastic packaging layer may be used to avoid grinding on the rear face of the first chip in a chip packaging process, and reduce processes in the chip packaging, thereby further reducing the costs of the chip packaging.

In a possible implementation of this embodiment of this application, an end face that is of the first conductor pillar and that is away from the second chip and an end face that is of the second conductor pillar and that is away from the second chip are flush, to obtain the planarization carrier board in the chip packaging process.

Optionally, the first interconnection structure may include at least one solder ball, at least one metal bump, at least one metal pillar, and the like.

In a possible implementation of this embodiment of this application, the chip package structure may further include a first redistribution layer, a second interconnection structure, a third chip, and a third conductor pillar. The first redistribution layer is disposed on a surface that is of the second chip (i.e., a rear face of the second chip) and that is away from the first chip. The third chip is disposed on a surface that is of the first redistribution layer and that is away from the first chip. The third chip is interconnected to the first redistribution layer by using the second interconnection structure. The third conductor pillar is configured to electrically connect the circuit in the carrier board to a circuit in the first redistribution layer.

Optionally, the third chip may further be replaced with a chip package structure in the conventional technology or any chip package structure in the first aspect of the embodiments of this application.

Further, the end face that is of the first conductor pillar and that is away from the second chip, the end face that is of the second conductor pillar and that is away from the second chip, and an end face that is of the third conductor pillar and that is away from the first redistribution layer are flush.

In the chip package structure, the first redistribution layer is disposed on an inactive layer of the second chip, to implement a multi-layer chip laminate, thereby reducing a size of the chip package structure and improving a chip integration degree.

In a possible implementation of this embodiment of this application, the chip package structure further includes a third interconnection structure. The third interconnection structure is disposed on a surface that is of the carrier board and that is away from the first chip. The third interconnection structure is used to connect the circuit in the carrier board to a circuit in a PCB.

According to a second aspect, an embodiment of this application further provides an integrated circuit. The integrated circuit includes a PCB and any chip package structure described in the first aspect. A circuit in a carrier board in the chip package structure is connected to a circuit in the PCB by using a third interconnection structure.

According to a third aspect, an embodiment of this application further provides an integrated circuit device. The integrated circuit device includes the integrated circuit described in the second aspect.

According to a fourth aspect, an embodiment of this application further provides a chip packaging method. The method includes providing a carrier sheet, at least one first chip, and a second chip, where a first conductor pillar is disposed in the first chip, and at least one second conductor pillar is disposed on an active layer of the second chip, bonding a rear face of the second chip to the carrier sheet, where the rear face of the second chip is a surface that is of the second chip and that is away from the active layer of the second chip, connecting an active layer of the first chip to the active layer of the second chip by using a first interconnection structure, forming a plastic packaging layer on the carrier sheet, the second chip, and the first chip, removing a part of the plastic packaging layer, to expose an end face that is of the first conductor pillar and that is away from the second chip, connecting a carrier board to the end face that is of the first conductor pillar and that is away from the first chip, and removing the carrier sheet, to obtain a chip package structure.

In the chip package structure prepared by using the foregoing method, an internal circuit of the first chip is electrically connected to a circuit in the carrier board by using the first conductor pillar disposed in the first chip, and an internal circuit of the second chip is electrically connected to the circuit in the carrier board by using a second conductor pillar disposed in the active layer of the second chip. The active layers of the two chips are connected face-to-face, to shorten a line of signal transmission between the two chips and improve efficiency of the signal transmission between the two chips.

Optionally, in this embodiment of this application, the carrier board may be a redistribution layer (for example, a second redistribution layer in the embodiments of this application), a PCB, a circuit board, a chip, a chip package structure, or the like. This is not limited in this embodiment of this application.

In a possible implementation of this embodiment of this application, a second conductor pillar is disposed on a surface of the active layer of the second chip. The method further includes removing a part of the plastic packaging layer, to expose an end face that is of the second conductor pillar and that is away from the second chip, and connecting the carrier board to the end face that is of the second conductor pillar and that is away from the second chip.

Optionally, the carrier board is a second redistribution layer. Connecting a carrier board to the end face that is of the first conductor pillar and that is away from the first chip and connecting the carrier board to the end face that is of the second conductor pillar and that is away from the second chip include forming the second redistribution layer on the remaining plastic packaging layer, where the first conductor pillar and the second conductor pillar are separately connected to the second redistribution layer.

In a possible implementation of this embodiment of this application, an implementation of connecting an active layer of the first chip to the active layer of the second chip by using a first interconnection structure may be connecting, by using the first interconnection structure, the active layer of the first chip to the active layer of the second chip through at least one of thermal compression bonding, eutectic bonding, embedded bump bonding, metal-metal direct bonding, and hybrid bonding.

In a possible implementation of this embodiment of this application, removing a part of the plastic packaging layer, to expose an end face that is of the first conductor pillar and that is away from the second chip and an end face that is of the second conductor pillar and that is away from the second chip may include but is not limited to the following three implementations.

In an implementation 1, the first conductor pillar is wrapped in the first chip, and one end of the first conductor pillar is electrically connected to the internal circuit of the first chip. Further, this implementation may include the following steps: removing a part of the plastic packaging layer disposed on a rear face of the first chip, to expose the rear face of the first chip, where the rear face of the first chip is a surface that is of the first chip and that is away from the active layer of the first chip, removing a part of a material of the rear face of the first chip, to expose the first conductor pillar with a preset length, forming a dielectric layer covering the first chip and the first conductor pillar, and removing a part of the plastic packaging layer and a part of the dielectric layer, to expose the end face that is of the first conductor pillar and that is away from the second chip and the end face that is of the second conductor pillar and that is away from the second chip.

When the implementation 1 is implemented, the dielectric layer is formed before grinding, to avoid simultaneous grinding on the first conductor pillar and a semiconductor material of the first chip. Therefore, the following case is avoided: a conductive particle in the first conductor pillar contaminates the semiconductor material of the first chip, to improve electrical performance of the chip.

In an implementation 2, the first conductor pillar is wrapped in the first chip. One end of the first conductor pillar is connected to the internal circuit of the first chip. Before forming a plastic packaging layer on the carrier sheet, the second chip, and the first chip, a first photoresist layer covering the carrier sheet, the second chip, and the first chip may be formed. The first photoresist layer is patterned to expose a rear face of the first chip. The patterned first photoresist layer is used as a mask, and a part of a material of the rear face of the first chip is removed, to expose the first conductor pillar with a preset length. The patterned first photoresist is removed.

In this case, the plastic packaging layer covering the carrier sheet, the second chip, and the first chip may be formed. A part of the plastic packaging layer is removed, to expose the end face that is of the first conductor pillar and that is away from the second chip and the end face that is of the second conductor pillar and that is away from the second chip.

In the implementation 2, a dielectric layer does not need to be formed. The plastic packaging layer is used to protect the rear face of the first chip from being ground, to reduce processes in the chip packaging, thereby further reducing the costs of the chip packaging.

In an implementation 3, one end of the first conductor pillar is connected to the internal circuit of the first chip, and the other end of the first conductor pillar is exposed outside the rear face of the first chip. In this case, after forming a plastic packaging layer covering the carrier sheet, the second chip, and the first chip, a first via may be disposed in a position of the plastic packaging layer relative to the first conductor pillar, to expose the end face that is of the first conductor pillar and that is away from the second chip, and a second via is disposed in a position of the plastic packaging layer relative to the second conductor pillar, to expose the end face that is of the second conductor pillar and that is away from the second chip.

When the implementation 3 is implemented, one end of the first conductor pillar in the first chip needs to be prepared, to be exposed outside the rear face of the first chip. In this case, a packaging material does not need to be ground, to further reduce processes in the chip packaging, thereby further reducing the costs of the chip packaging.

In a possible implementation of this embodiment of this application, before bonding a rear face of the second chip to the carrier sheet, the method further includes successively forming a first redistribution layer and a third conductor pillar on the carrier sheet, where the third conductor pillar is disposed on a surface that is of the first redistribution layer and that is away from the carrier sheet, and one end of the third conductor pillar is connected to the first redistribution layer.

In this case, an implementation of bonding a rear face of the second chip to the carrier sheet may be bonding the rear face of the second chip to the surface that is of the first redistribution layer and that is away from the carrier sheet.

Before the carrier board is formed on the plastic packaging layer, the method further includes disposing a third via in a position of the plastic packaging layer relative to the third conductor pillar, to expose an end face that is of the third conductor pillar and that is away from the first redistribution layer.

After the carrier board is formed on the plastic packaging layer, the other end of the third conductor pillar is connected to the carrier board.

Optionally, after removing the carrier sheet, the method may further include connecting the third chip to the first redistribution layer by using a second interconnection structure.

Optionally, the third chip may further be replaced with a chip package structure in the conventional technology or any chip package structure in the first aspect of the embodiments of this application.

In the chip package structure, the first redistribution layer is disposed on the rear face of the second chip, to implement a multi-layer chip laminate, thereby reducing a size of the chip package structure and improving a chip integration degree.

BRIEF DESCRIPTION OF DRAWINGS

FIG. 8 is a schematic flowchart of a chip packaging method according to an embodiment of this application;

DESCRIPTION OF EMBODIMENTS

Figure 1:
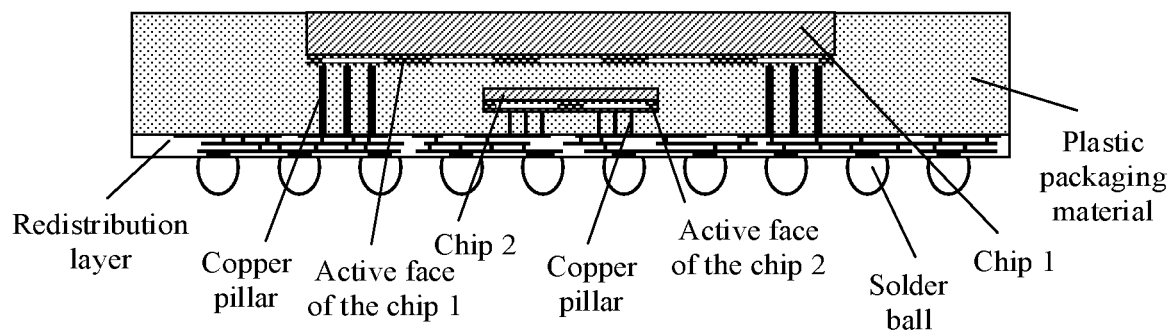
FIG. 1 is a schematic diagram of a structure of a chip package structure provided in the conventional technology.

For ease of understanding, some concepts and backgrounds are first briefly described.

A PCB is an important electronic part, a support body for an electronic component, and a carrier for an electrical connection between electronic components. It is referred to as the "printed" circuit board because the PCB is manufactured through an electronic printing technology. An input/output (I/O) end of a chip is electrically connected to the PCB by using a surface mount technology (SMT).

A wafer is a silicon wafer used in manufacturing of a silicon semiconductor integrated circuit (IC). The wafer has a circular shape, and therefore it is referred to as wafer. Various circuit element structures can be manufactured on a silicon wafer, to form an IC product with a specific electrical function.

A die is a small piece cut from a wafer, and is also referred to as a chip. Before a wafer is packaged, a chip on the wafer or a chip obtained by cutting the wafer is referred to as a bare chip.

A through silicon via (TSV) is a through hole passing through a silicon layer and formed in a chip manufacturing process or a chip packaging process. The through via is filled with a conductive material. It should be understood that, in each embodiment of this application, a through silicon via in a first chip is a first conductor pillar.

A through-dielectric-via (TDV) is a through hole passing through a dielectric material and formed in a chip packaging process. The through via is filled with a conductive material.

A through molding via (TMV) is a through hole passing through a plastic packaging layer and formed in a chip packaging process. The through via is filled with a conductive material. It should be understood that, in each embodiment of this application, each of a second conductor pillar and a third conductor pillar passing through the plastic packaging layer may be referred to as the through molding via.

It should be noted that in the embodiments of this application, a "first chip", a "second chip", and a "third chip" are general terms to limit a relative location and a connection manner between chips. It should be understood that, in a chip package structure, "first chips" in different positions may be chips with the same function, the same manufacturing process, and the like, or chips with different functions, different manufacturing processes, and the like.

An electrical connection between one component and another component in this application is also referred to as a "connection", a "coupling", an "interconnection", a "direct connection", or the like.

In the embodiments of this application, a chip such as the first chip, the second chip, or the third chip may be a bare chip, or may be a chip formed through simply packaging a bare chip and another chip or component (an active component, or a passive component, or the like), or may be a chip package structure formed after packaging. This is not limited herein. In specific application scenarios, the chip may be a chip such as a memory, an AP, micro-electromechanical systems (MEMS), a microwave radio frequency chip, or an application-specific integrated circuit (ASIC). It should be understood that the AP chip or the application-specific integrated circuit may be a central processing unit (CPU), a graphics processing unit (GPU), or an artificial intelligence processor such as a network processing unit (NPU) in specific application. The memory may be a cache, a random-access memory (RAM), a read-only memory (ROM), or another memory. It should be understood that the chips listed herein are merely examples for description. This is not limited in this application.

The following clearly describes the technical solutions in the embodiments of this application with reference to the accompanying drawings in the embodiments of this application.

Figure 2:
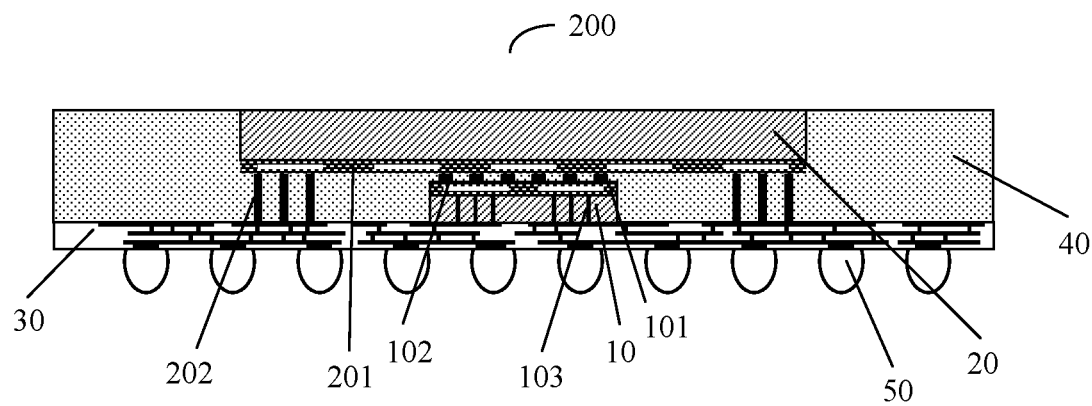
FIG. 2 is a schematic cross-sectional diagram of a first-type chip package structure according to an embodiment of this application.

FIG. 2 is a schematic cross-sectional diagram of a first-type chip package structure according to an embodiment of this application. The chip package structure 200 may be obtained through fan-out wafer-level package (FOWLP). The chip package structure 200 may include at least one first chip 10, a second chip 20, a carrier board 30, and a plastic packaging layer 40 covering at least one surface of the first chip 10 and the second chip 20. An active layer 101 of the first chip 10 is opposite to an active layer 201 of the second chip 20. The active layer 101 and the active layer 201 are directly connected by using a first interconnection structure 102. At least one first conductor pillar 103 is disposed in the first chip 10. The first conductor pillar 103 is connected to the active layer 101 in the first chip 10 and is configured to connect a circuit in the active layer 101 to a circuit in the carrier board 30.

It should be understood that, in this embodiment of this application, the carrier board may be a redistribution layer (for example, a second redistribution layer in the embodiments of this application), a PCB, a circuit board, a chip, a chip package structure, or the like. This is not limited in this embodiment of this application. In this embodiment of this application, that the carrier board 30 is a redistribution layer is used as an example for description.

It should be noted that the first conductor pillar 103 in the first chip 10 may also be referred to as a through silicon via in a case in which the first chip 10 is a bare chip or in another case.

Optionally, there is at least one second conductor pillar 202 between the second chip 20 and the carrier board 30. One end of the second conductor pillar 202 is electrically connected to a circuit in the active layer 201 of the second chip 20, and the other end of the second conductor pillar 202 is electrically connected to the circuit in the carrier board 30. The second conductor pillar 202 bypasses the first chip 10 and is configured to connect the internal circuit of the second chip 20 to the circuit in the carrier board 30.

It should be noted that the second conductor pillar 202 passes through the plastic packaging layer 40 to be connected to the carrier board 30. In this case, the second conductor pillar 202 may be a through molding via.

As shown in FIG. 2, one end of the first conductor pillar 103 is electrically connected to the internal circuit of the first chip 10, and the other end of the first conductor pillar 103 passes through the first chip 10 to be electrically connected to the circuit in the carrier board 30, to implement a connection between the internal circuit of the first chip 10 and the carrier board 30.

One end of the second conductor pillar 202 is electrically connected to the internal circuit of the second chip 20, and the other end of the second conductor pillar 202 passes through the plastic packaging layer 40 to be electrically connected to the carrier board 30, to implement a connection between the internal circuit of the second chip 20 and the carrier board 30.

In the chip package structure, the active layer 101 of the first chip 10 and the active layer 201 of the second chip 20 are connected face-to-face, to shorten a distance of signal transmission between the first chip 10 and the second chip 20. In this way, some I/O ends of the second chip 20 are connected to some I/O ends of the first chip 10 in a short distance, thereby implementing fast signal transmission between the first chip 10 and the second chip 20.

Figure 3:
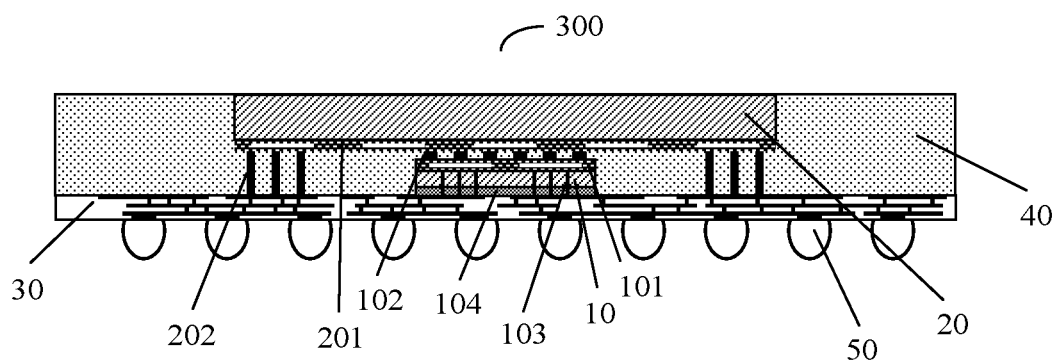
FIG. 3 is a schematic cross-sectional diagram of a second-type chip package structure according to an embodiment of this application.

FIG. 3 is a schematic cross-sectional diagram of a second-type chip package structure according to an embodiment of this application. In addition to the components shown in FIG. 2, a chip package structure 300 further includes a dielectric layer 104 disposed on a surface that is of the first chip 10 (also referred to as a rear face of the first chip 10) and that is away from the second chip 20. The first conductor pillar 103 passes through the dielectric layer 104 to be electrically connected to the carrier board 30.

It should be noted that one end of the first conductor pillar 103 is electrically connected to the active layer 101 of the first chip 10, and the other end of the first conductor pillar 103 passes through the first chip 10 and the dielectric layer 104 to be electrically connected to the circuit in the carrier board 30. In this case, the first conductor pillar 103 is actually a TDV).

The dielectric layer 104 may be used to avoid simultaneous grinding on the first conductor pillar 103 and a semiconductor material of the first chip 10 in a grinding process. Therefore, the following case can be avoided: a conductive particle in the first conductor pillar 103 contaminates the semiconductor material of the first chip 10, to improve electrical performance of the chip.

Optionally, in the chip package structures 200 and 300, a surface that is of the plastic packaging layer 40 and that is away from the second chip 20, a surface that is of the dielectric layer 104 and that is away from the first chip 10, an end face that is of the first conductor pillar 103 and that is away from the second chip 20, and an end face that is of the second conductor pillar 202 and that is away from the second chip 20 are flush, to improve planarization of the prepared carrier board 30 and improve electrical performance of the chip package structure.

Figure 4:
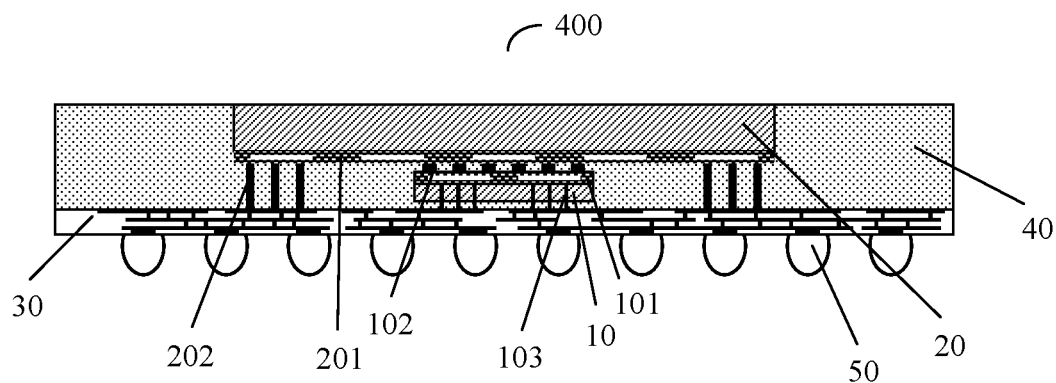
FIG. 4 is a schematic cross-sectional diagram of a third-type chip package structure according to an embodiment of this application.

FIG. 4 is a schematic cross-sectional diagram of a third-type chip package structure according to an embodiment of this application. A chip package structure 400 may include the components shown in FIG. 2. The first conductor pillar 103 passes through the plastic packaging layer 40 to be electrically connected to the circuit in the carrier board 30. Similarly, the second conductor pillar 202 passes through the plastic packaging layer 40 to be electrically connected to the circuit in the carrier board 30.

In another implementation of this embodiment of this application, a first via is disposed on the plastic packaging layer 40 relative to the first conductor pillar 103, and a second via is disposed on the plastic packaging layer 40 relative to the second conductor pillar 202. The carrier board 30 is electrically connected to the first conductor pillar 103 by using the first via and is electrically connected to the second conductor pillar 202 by using the second via.

The plastic packaging layer 40 in the chip package structure shown in FIG. 4 may be used to avoid grinding on the rear face of the first chip in a chip packaging process, and reduce processes in the chip packaging, thereby further reducing the costs of the chip packaging.

In a first application scenario of this embodiment of this application, in the chip package structures 200, 300, and 400, the first chip 10 may be a cache or a RAM, and the second chip 20 may be an AP chip.

In a second application scenario of this embodiment of this application, in the chip package structures 200, 300, and 400, the first chip 10 may be specifically a GPU or an NPU, and the second chip 20 may be an AP chip.

In a third application scenario of this embodiment of this application, in the chip package structures 200, 300, and 400, the first chip 10 may be an AP chip, and the second chip 20 may be a cache or a RAM.

It should be understood that, in addition to the foregoing application scenarios, this embodiment of this application may be further applied to another application scenario. This is not limited in this embodiment of this application.

Figure 5:
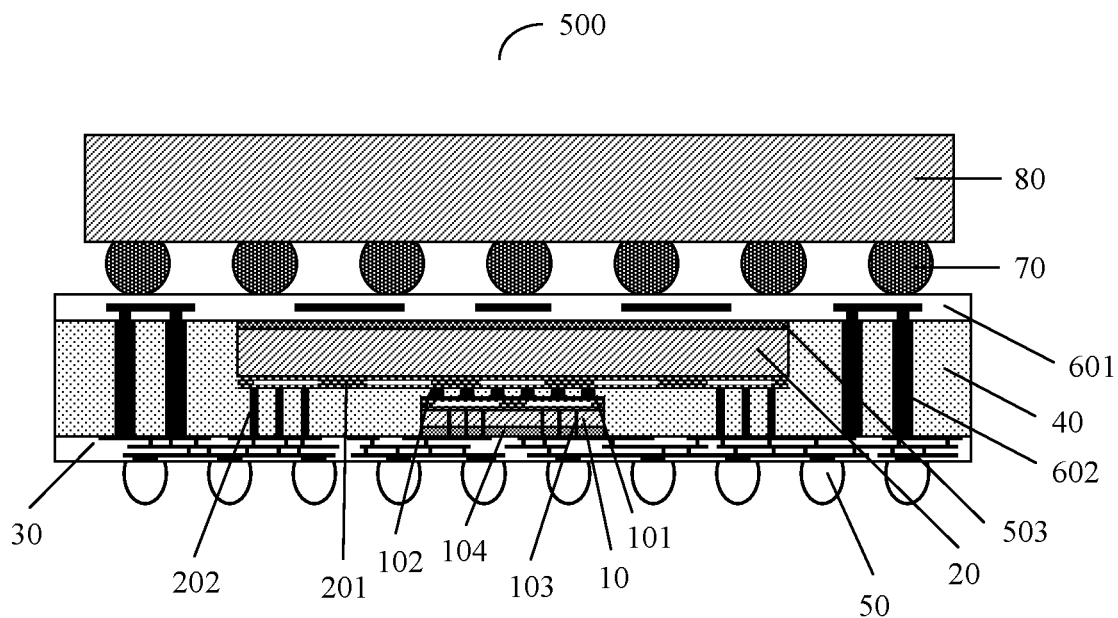
FIG. 5 is a schematic cross-sectional diagram of a fourth-type chip package structure according to an embodiment of this application.

In a possible implementation of this embodiment of this application, in addition to the components in the chip package structures shown in FIG. 2, FIG. 3, or FIG. 4, the chip package structure may further include a first redistribution layer, a third conductor pillar, a second interconnection structure, and a third chip. In this embodiment of this application, the chip package structure shown in FIG. 2 is used as an example for description. As shown in FIG. 5, the second chip 20 in the chip package structure 500 may be bonded to a surface of a first redistribution layer 601 by using an adhesive material 503. To be specific, the first redistribution layer 601 is bonded to a surface that is of the second chip 20 (i.e., an inactive layer of the second chip 20 in this application) and that is away from the first chip 10. A third chip 80 is disposed on a surface that is of the first redistribution layer 601 and that is away from the first chip 10. The third chip 80 is electrically connected to the first redistribution layer 601 by using a second interconnection structure 70. A third conductor pillar 602 is configured to electrically connect the circuit in the carrier board 30 to a circuit in the first redistribution layer 601.

One end of the third conductor pillar 602 is electrically connected to the circuit in the carrier board 30, and the other end of the third conductor pillar 602 is electrically connected to the circuit in the first redistribution layer 601. An internal circuit of the third chip 80 is electrically connected to the circuit in the first redistribution layer 601, to implement an electrical connection between the internal circuit of the third chip 80 and the carrier board 30.

In a first electrical connection manner used between the internal circuit of the third chip 80 and the first redistribution layer 601, an active layer of the third chip 80 may face the first redistribution layer 601. In this case, the first redistribution layer 601 may be electrically connected to the active layer of the third chip 80 by using the second interconnection structure 70, to implement signal transmission between the third chip 80 and each of the first chip 10, the second chip 20, a PCB, and the like.

In a second electrical connection manner used between the internal circuit of the third chip 80 and the first redistribution layer 601, an active layer of the third chip 80 may be away from the first redistribution layer 601. In this case, the third chip 80 may include a fourth conductor pillar passing through the third chip 80. One end of the fourth conductor pillar is electrically connected to the internal circuit of the third chip 80, and the other end of the fourth conductor pillar is electrically connected to the first redistribution layer 601 by using the second interconnection structure 70, so that the third chip 80 can be electrically connected to the first redistribution layer 601 by using the fourth conductor pillar in the third chip 80, the second interconnection structure 70, or the like, to implement signal transmission between the third chip 80 and each of the first chip 10, the second chip 20, a PCB, and the like.

In a fourth application scenario of this embodiment of this application, in the chip package structure 500, the first chip 10 may be a cache, the second chip 20 may be an AP chip, and the third chip 80 may be a RAM.

In a fifth application scenario of this embodiment of this application, in the chip package structure 500, the first chip 10 may be a RAM, the second chip 20 may be an AP chip, and the third chip 80 may be a GPU or an NPU.

It should be understood that, in addition to the foregoing application scenarios, this embodiment of this application may be further applied to another application scenario. This is not limited in this embodiment of this application.

In another implementation of this embodiment of this application, the chip package structures 200, 300, 400, and 500 may further include a third interconnection structure 50 configured to connect to a PCB, so that the chip package structure is coupled to the PCB. In another implementation of this embodiment of this application, the third interconnection structure 50 may further be connected to another chip package structure. Details are not described herein again.

Figure 6:
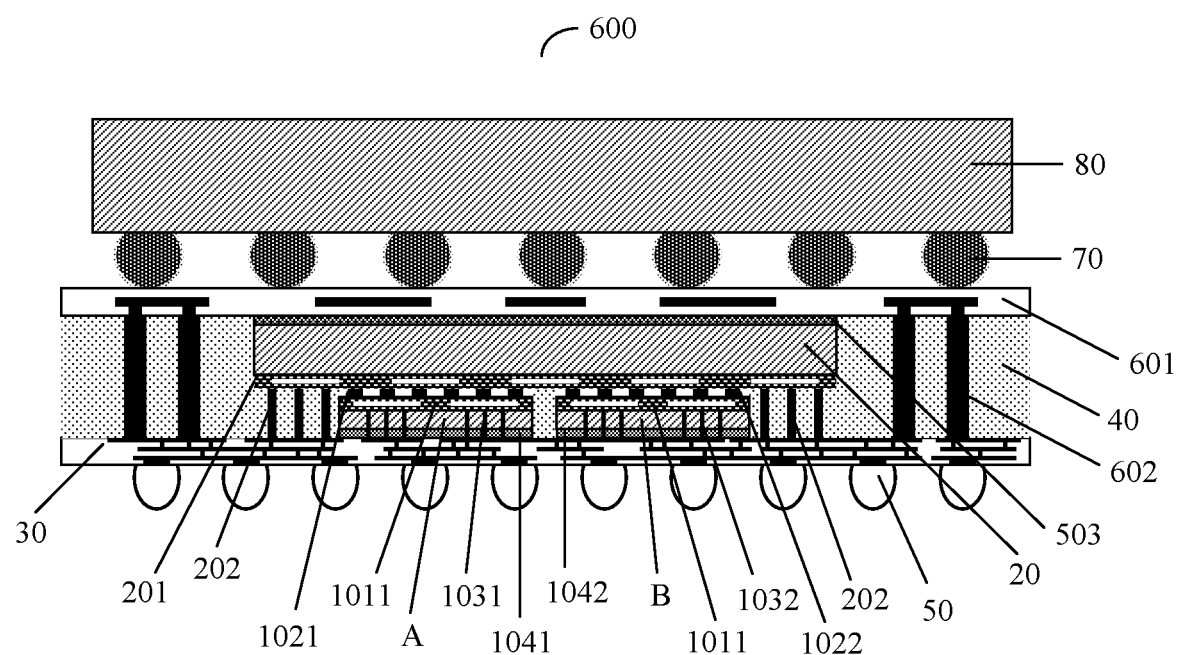
FIG. 6 is a schematic cross-sectional diagram of a fifth-type chip package structure according to an embodiment of this application.

The chip package structures 200, 300, 400, and 500 shown in FIG. 2 to FIG. 5 are described by merely using an example in which the chip package structure includes one first chip 10. It should be understood that a larger size of the chip indicates a lower yield, the higher costs, greater stress, and a higher warpage risk. Optionally, some large chips may be divided into a plurality of small chips, to be interconnected to the second chip 20, thereby improving a chip yield. The chip package structure may include a plurality of first chips 10. The plurality of first chips 10 may be same chips or different chips. FIG. 6 is a schematic cross-sectional diagram of a fifth-type chip package structure. The chip package structure shown in FIG. 6 includes two first chips 10: a chip A and a chip B. The chip A and the chip B are disposed side by side on the active layer 201 of the second chip 20, and are electrically connected to the second chip 20 by respectively using an interconnection structure 1021 and an interconnection structure 1022. Optionally, dielectric layers 1041 and 1042 are respectively disposed on a surface that is of the chip A and that is away from the second chip 20 and a surface that is of the chip B and that is away from the second chip 20. First conductor pillars 1031 and 1032 are respectively disposed in the chip A and the chip B, to transmit signals between the second chip 20 and the carrier board 30.

Generally, a cache may include a plurality of levels. Generally, the cache may include a level-1 cache (L1), a level-2 cache (L2), and a level-3 cache (L3). Herein, L represents a level. In the fifth implementation scenario of this embodiment of this application, the second chip 20 may be an AP chip. The AP chip includes L1 and L2. The chip A may be L3, and the chip B may be a GPU. The third chip 80 may be a RAM.

In a sixth implementation scenario of this embodiment of this application, the second chip 20 may be an AP chip. The chip A may be a GPU, and the chip B may be an NPU. The third chip 80 may be a RAM.

In a seventh implementation scenario of this embodiment of this application, the second chip 20 may be an AP chip. The chip A may be a RAM, and the chip B may be an NPU. The third chip 80 may be a GPU.

It should be understood that, in addition to the foregoing application scenarios, this embodiment of this application may be further applied to another application scenario. This is not limited in this embodiment of this application.

In the foregoing application scenarios, the third chip 80 may alternatively be a memory, a silicon die, a flip chip package, a passive device, MEMS, or the like.

An embodiment of this application further provides a chip package structure group. The chip package structure group may include one or more chip package structures shown in FIG. 2 to FIG. 6. An electrical connection is implemented between two adjacent chip package structures by using the third interconnection structure 50 and the first redistribution layer 601.

Figure 7:
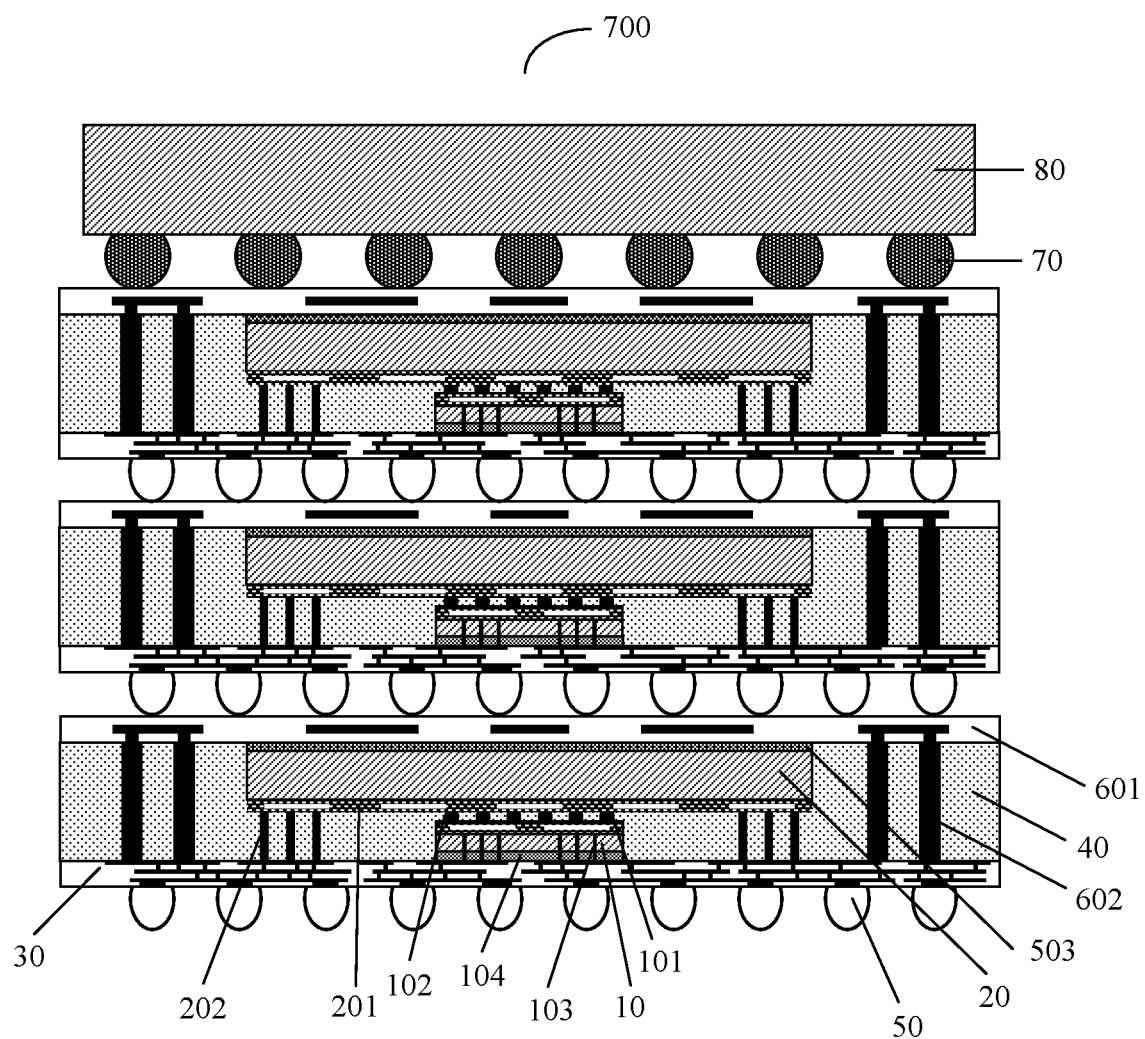
FIG. 7 is a schematic cross-sectional diagram of a sixth-type chip package structure according to an embodiment of this application.

It should be understood that the chip package structure group 800 shown in FIG. 7 is described by using the chip package structures shown in FIG. 5 and FIG. 2 as an example. It should be understood that the chip package structure group may further include more chip package structures. Any one or more chip package structures in the chip package structure group may be alternatively chip package structures in the conventional technology. This is not limited in this embodiment of this application.

It should be further understood that the first chips 10 in different chip package structures in the chip package structure group may be chips with the same function, the same manufacturing process, and the like, or may be chips with different functions, different manufacturing processes, and the like, and similarly, the second chips 20 in different chip package structures may be chips with the same function, the same manufacturing process, and the like, or may be chips with different functions, different manufacturing processes, and the like.

The chip package structure group shown in FIG. 7 may be implemented as a multi-layer chip package structure. A volume of the chip package structure may be compressed, to implement production of an electronic device with a small size.

To prepare a chip package body, this application further provides a chip packaging method. In this method, a fan-out wafer-level package technology is used. By using this method, a chip package body with stable performance and a relatively high yield can be conveniently manufactured. With reference to a schematic flowchart of a chip packaging method shown in FIG. 8 and schematic cross-sectional diagrams of structures obtained by using various steps shown in FIG. 9A to FIG. 9O, the chip packaging method may include but is not limited to some or all steps in the following:

S02: Provide a carrier sheet 600, at least one first chip 10, and a second chip 20, where at least one first conductor pillar 103 is disposed in the first chip 10.

Figure 9A:
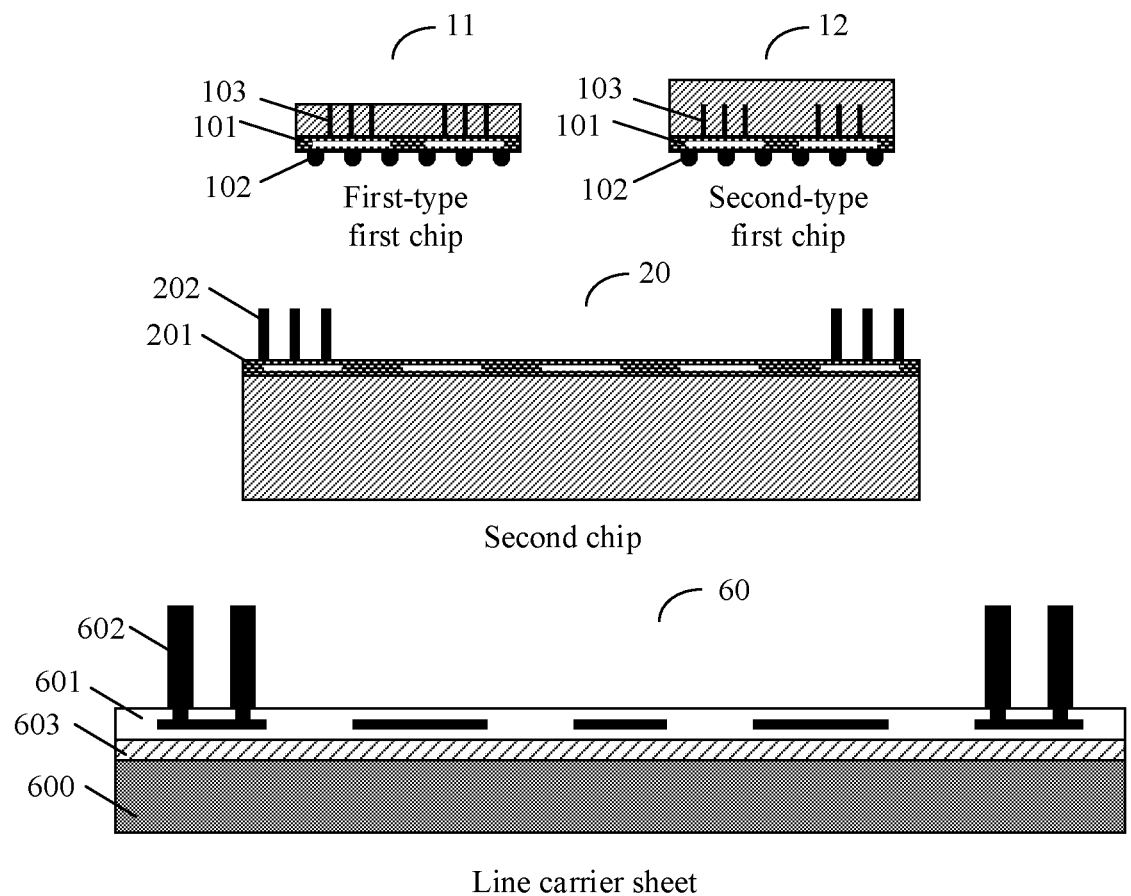
FIG. 9A, FIG. 9B, FIG. 9C, FIG. 9D, FIG. 9E, FIG. 9F, FIG. 9G, FIG. 9H, FIG. 9I, FIG. 9J, FIG. 9K, FIG. 9L, FIG. 9M, FIG. 9N, and FIG. 9O are schematic cross-sectional diagrams of structures obtained in processes in a chip packaging method according to an embodiment of this application.

Optionally, there is at least one second conductor pillar 202 disposed on a surface of an active layer 201 of the second chip 20. FIG. 9A shows the first chips 11 and 12, and the second chip 20.

In an implementation 1 of this embodiment of this application (for example, the implementation of forming the chip package structure shown in FIG. 5 or FIG. 6), before step S4, the method may further include:

S03: Successively prepare, on the carrier sheet 600, a first redistribution layer 601 and a third conductor pillar 602 electrically connected to the first redistribution layer 601, to obtain a line carrier sheet 60, as shown in the schematic cross-sectional diagram of the line carrier sheet 60 in FIG. 9A.

In a specific implementation of step S03, a temporary bonding adhesive layer 603 may be formed on the carrier sheet 600, and then the first redistribution layer 601 is prepared on the temporary bonding adhesive layer 603. Further, the at least one third conductor pillar 602 is prepared on the first redistribution layer 601. One end of the third conductor pillar 602 is electrically connected to a circuit in the first redistribution layer 601. The temporary bonding adhesive layer 603 may be a hot melt adhesive or an optical clear adhesive, so that the carrier sheet 600 is subsequently separated from the first redistribution layer 601 layer through heating or lighting.

In an implementation 2 of this embodiment of this application (for example, the implementation of forming the chip package structure shown in FIG. 2, FIG. 3, or FIG. 4), the carrier sheet 600 may not include the first redistribution layer 601 and the third conductor pillar 602, and a first surface of the second chip 20 may be temporarily bonded to and fastened to the carrier sheet 600 by using a hot melt adhesive or an optical clear adhesive.

The carrier sheet 600 may be a silicon chip, a glass sheet, or the like. The silicon chip or the glass sheet may be a wafer-level size or a board-level size.

It should be understood that, in a manufacturing process of the first chip, before a wafer is cut to obtain the first chip, the first conductor pillar may be formed in the first chip, and the first interconnection structure may be formed on the surface of the active layer of the first chip. Generally, the first chip formed after a chip manufacturing process includes a relatively thick substrate, for example, a silicon substrate. Based on whether the first conductor pillar 103 penetrates the substrate of the first chip, the first chip may be classified into two types of chips. As shown in FIG. 9A, in the first-type first chip 11, the first conductor pillar 103 may penetrate the first chip 11, and an end face that is of the first conductor pillar 103 and that is away from the active layer 101 is exposed outside the first chip 11. In the second-type first chip 12, the first conductor pillar 103 is disposed in the first chip 12, and subsequently, the substrate of the first chip 12 is ground to expose the end face that is of the first conductor pillar 103 and that is away from the active layer 101. In this embodiment of this application, the second-type first chip 12 is used as an example for description. The first conductor pillar 103 is made of a conductive material such as a metal or a metal alloy of copper, silver, or palladium.

As shown in FIG. 9A, the second chip 20 may include at least one second conductor pillar 202. It should be understood that, in a manufacturing process of the second chip 20, before a wafer is cut to obtain the second chip 20, the at least one second conductor pillar 202 is formed on the active layer 201 of the second chip 20. Alternatively, the second conductor pillar 202 may be formed in a chip packaging process. For example, before step S04, a plurality of second conductor pillars 202 are formed on a surface of the active layer 201 of the second chip 20 by using a method such as photolithography, thin film deposition, or electroplating. The second conductor pillar 202 may be alternatively formed by using another process. This is not limited in this embodiment of this application.

A first interconnection structure 102 may also be formed on the surface of the active layer 201 of the second chip 20. Alternatively, a part of the first interconnection structure 102 is formed on the active layer 101 of the first chip 11/12, and a part of the first interconnection structure 102 is formed on the active layer 201 of the second chip 20. For example, a solder ball is disposed on the active layer 101 of the first chip 11/12, and a pad is disposed on the active layer 201 of the second chip 20. This is not limited in this embodiment of this application.

Optionally, the first conductor pillar 103 and the first interconnection structure 102 may also be completed in the chip packaging process. For example, before step S04, the first interconnection structure 102 may be formed on the surface of the active layer 101 of the first chip 11/12 or the surface of the active layer 201 of the second chip 20. This is not limited in this embodiment of this application.

S04: Bond a rear face of the second chip 20 to the carrier sheet 600, where the rear face of the second chip 20 is a surface that is of the second chip 20 and that is away from the active layer 201 of the second chip 20.

Figure 9B:
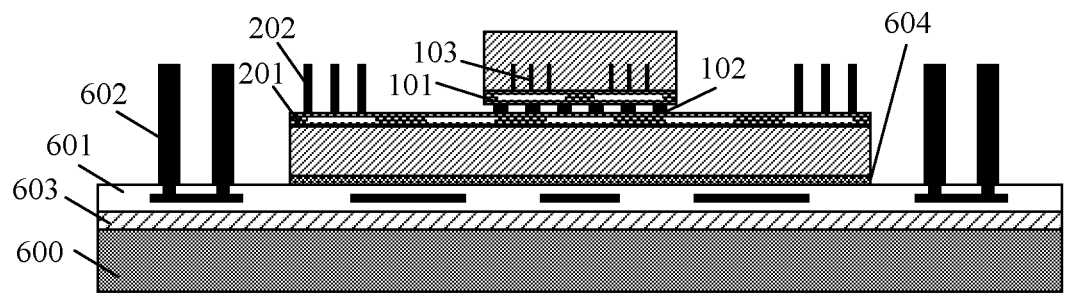

In correspondence to the implementation 1, as shown in FIG. 9B, the rear face of the second chip 20 may be bonded, by using an adhesive material 604, to a surface that is of the first redistribution layer 601 and that is away from the carrier sheet 600.

In correspondence to the implementation 2, the first redistribution layer 601 and the third conductor pillar 602 may be not included on the carrier sheet 600, and the rear face of the second chip 20 may be directly bonded to the carrier sheet 600.

S06: Connect the active layer 101 of the first chip 11/12 to the active layer 201 of the second chip 20 by using the first interconnection structure 102. As shown in FIG. 9B, the second-type first chip 12 is used as an example.

The first interconnection structure 102 is included on the first chip 12 or the second chip 20. The first interconnection structure 102 may be a solder ball, a pad, a metal bump, a metal pillar, or the like. An interconnection method includes but is not limited to thermal compression bonding, eutectic bonding, embedded bump bonding, metal-metal direct bonding, hybrid bonding, and the like.

After the interconnection, some I/O ends of the second chip 20 may be electrically connected to some I/O ends of the first chip 10 by using the first interconnection structure 102. The active layer 101 of the first chip 12 and the active layer 201 of the second chip 20 are directly connected face-to-face, to shorten a distance between the active layers of the two chips, thereby implementing fast signal transmission between the first chip 12 and the second chip 20.

It should be understood that, step S6 may be performed at any moment after step S2 and before step S8. This is not limited in this embodiment of this application.

S08: Form a plastic packaging layer 40 on the carrier sheet 600, the second chip 20, and the first chip 11/12, and remove a part of the plastic packaging layer 40, to expose the end face that is of the first conductor pillar 103 and that is away from the second chip 20.

It should be understood that, when the second conductor pillar is disposed on the surface of the active layer 201 of the second chip 20, after the part of the plastic packaging layer 40 is removed, an end face that is of the second conductor pillar 202 and that is away from the second chip 20 further needs to be exposed.

Figure 9C:
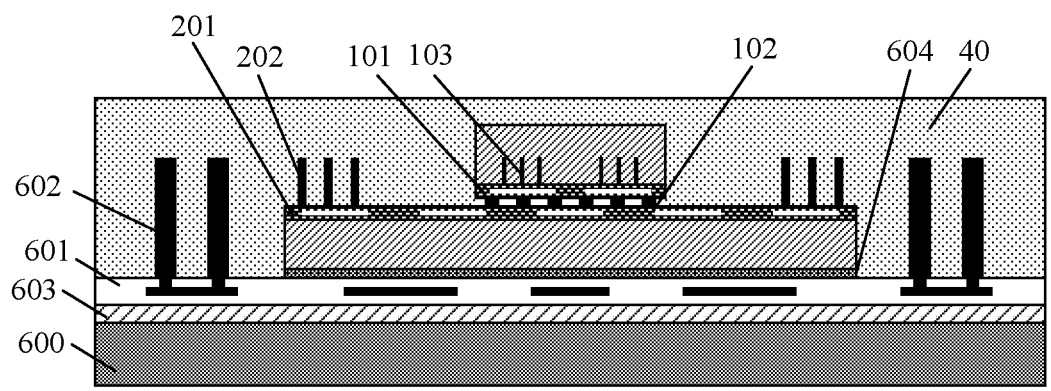

The plastic packaging layer 40 has functions of insulation, preventing a chip from being oxidized, and supporting the chip package structure. Step S8 may include but is not limited to the following three possible implementations.
Implementation 1:

In the implementation 1, before step S8, the first chip 10 is the second-type first chip 12. In other words, the first conductor pillar 103 is wrapped in the first chip 10, and one end of the first conductor pillar 103 is electrically connected to an internal circuit of the first chip 10. Further, this implementation may include the following steps:

S811. Form the plastic packaging layer 40 covering the carrier sheet 600, the second chip 20, and the first chip 12, thereby obtaining a structure shown in FIG. 9C.

S812. Remove a part of the plastic packaging layer disposed on the rear face of the first chip 12, to expose the rear face of the first chip 12.

Figure 9D:
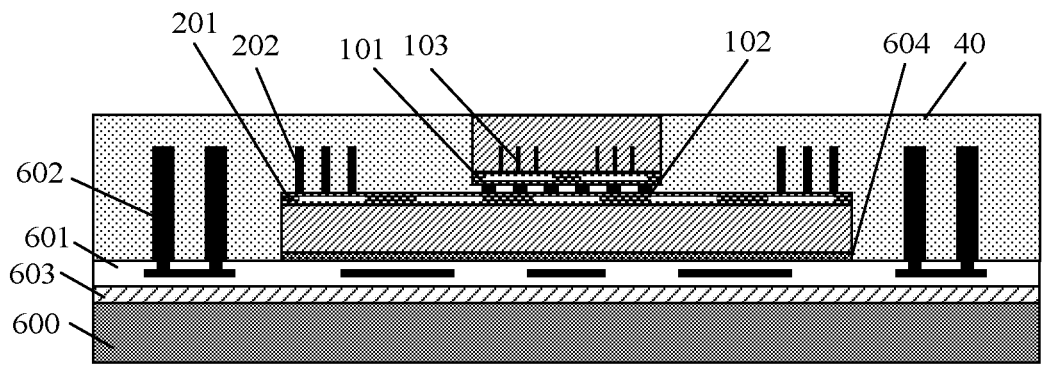

In an implementation of step S812, the plastic packaging layer may be ground by using a grinding process and a polishing process until the rear face of the first chip 12 is exposed, thereby obtaining a structure shown in FIG. 9D.

In another implementation of step S812, the part of the plastic packaging layer 40 disposed on the rear face of the first chip 12 may be removed through photolithography, to expose the rear face of the first chip 12.

Figure 9E:
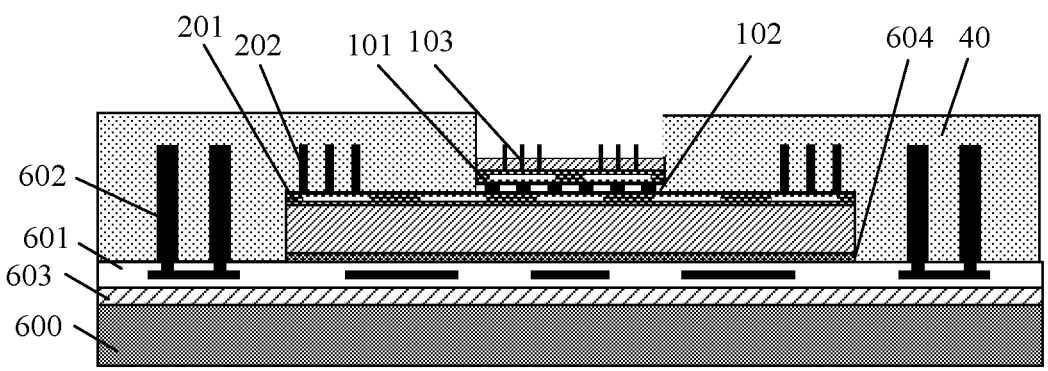

S813. Remove a part of a material of the rear face of the first chip 12, to expose the first conductor pillar 103 with a preset length, thereby obtaining a structure shown in FIG. 9E.

In a specific implementation, only a silicon material of the rear face of the first chip 12 (that is, the surface that is of the first chip 12 and that is away from the second chip 20) may be etched by using a dry etching process, and the first conductor pillar 103 is not etched, to finally expose the first conductor pillar 103 with the preset length. The preset length may be 0.1 microns to 2 microns, for example, 0.2 microns, 0.5 microns, 1 micron, or 1.2 microns. It should be understood that a part of the silicon substrate on the rear face of the first chip 12 is removed in the etching, and the preset length is less than a total length of the first conductor pillar 103. It should be further understood that for different semiconductor materials, a proper process may be selected to implement a task of partially removing the material of the rear face of the first chip 12.

It should be understood that a proper process may be selected based on whether the plastic packaging layer 40 is formed, a material of the plastic packaging layer 40, and a material of the first conductor pillar 103. The material of the rear face of the first chip 12 is removed when the first conductor pillar 103 is not damaged or is hardly damaged. Details are not described in this embodiment of this application.

Figure 9F:
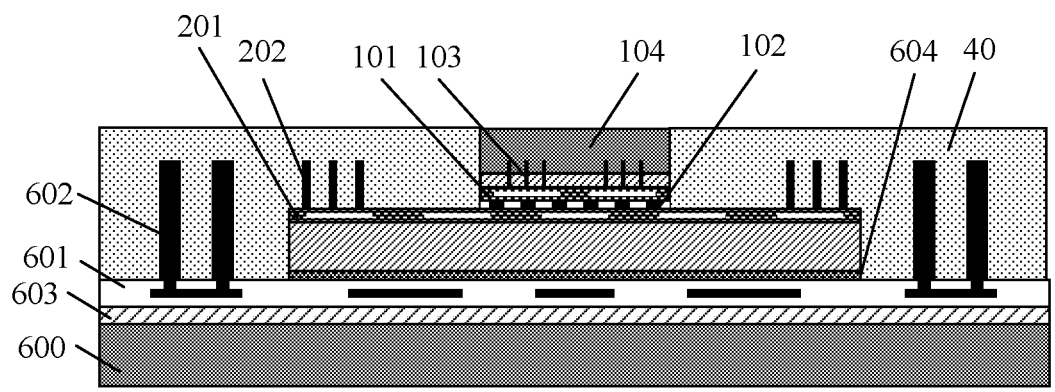

S814. Form a dielectric layer 104 covering the first chip 12 and the first conductor pillar 103, thereby obtaining a structure shown in FIG. 9F.

Figure 9G:
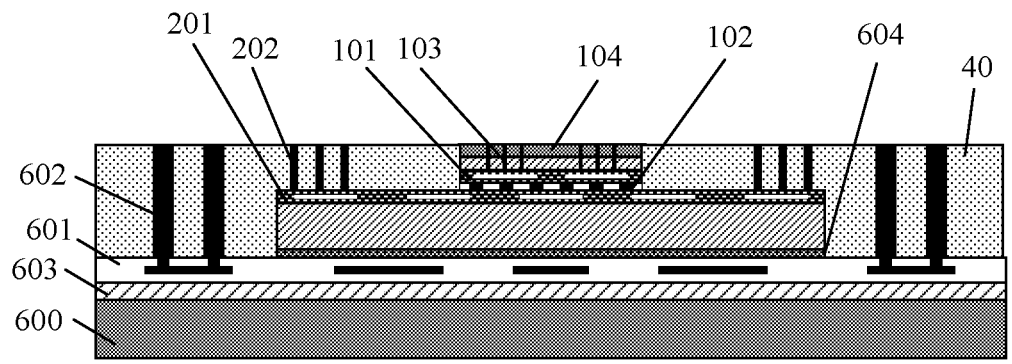

S816. Remove a part of the plastic packaging layer 40 and a part of the dielectric layer 104, to expose the end face that is of the first conductor pillar 103 and that is away from the second chip 20. It should be understood that, when the second conductor pillar 202 is disposed on the surface of the active layer 201 of the second chip 20, the end face that is of the second conductor pillar 202 and that is away from the second chip 20 further needs to be exposed, thereby obtaining a structure shown in FIG. 9G.

It should be understood that if the carrier sheet 600 includes the first redistribution layer 601 and the third conductor pillar 602, an end face that is of the third conductor pillar 602 and that is away from the first distribution layer 601 further needs to be exposed in the structure formed after the part of the plastic packaging layer 40 is removed.

In a specific implementation, the plastic packaging layer 40 and the dielectric layer 104 may be ground and/or polished until the end face that is of the first conductor pillar 103 and that is away from the second chip 20, the end face that is of the second conductor pillar 202 and that is away from the second chip 20, and the end face that is of the third conductor pillar 602 and that is away from the first redistribution layer 601 are exposed. It should be further understood that the first conductor pillar 103, the second conductor pillar 202, and the third conductor pillar 602 may have different heights. In this case, a protruding conductor pillar further needs to be ground, to obtain a planarization structure layer. In other words, the surface that is of the plastic packaging layer 40 and that is away from the carrier sheet 600, the rear face of the first chip 12, the end face that is of the first conductor pillar 103 and that is away from the second chip 20, the end face that is of the second conductor pillar 202 and that is away from the second chip 20, and the end face that is of the third conductor pillar 602 and that is away from the first redistribution layer 601 are flush.

When the implementation 1 is implemented, the dielectric layer is formed before the grinding, to avoid simultaneous grinding on the first conductor pillar 103 and a semiconductor material of the first chip 12. Therefore, the following case is avoided: A conductive particle in the first conductor pillar 103 contaminates the semiconductor material of the first chip 12, to improve electrical performance of the chip.

Figure 9H:
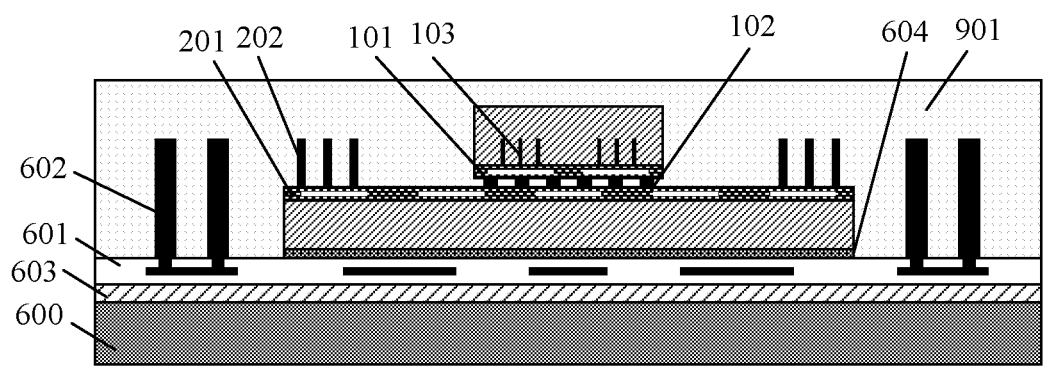

Implementation 2:

In the implementation 2, before step S8, the first chip is the second-type first chip 12. In other words, the first conductor pillar 103 is wrapped in the first chip 12, and one end of the first conductor pillar 103 is electrically connected to an internal circuit of the first chip 12. Before the plastic packaging layer 40 is formed on the carrier sheet 600 and the second chip 20, the method further includes steps S71 to S74. The steps are as follows:

S71. Form a first photoresist layer 901 covering the carrier sheet 600, the second chip 20, and the first chip 12, thereby obtaining a structure shown in FIG. 9H.

Figure 9I:
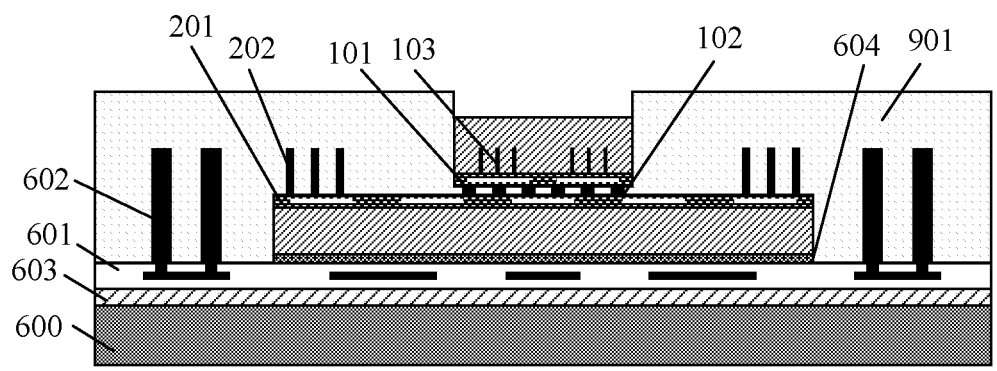

S72. Pattern the first photoresist layer 901 to expose the rear face of the first chip 12, thereby obtaining a structure shown in FIG. 9I.

Figure 9J:
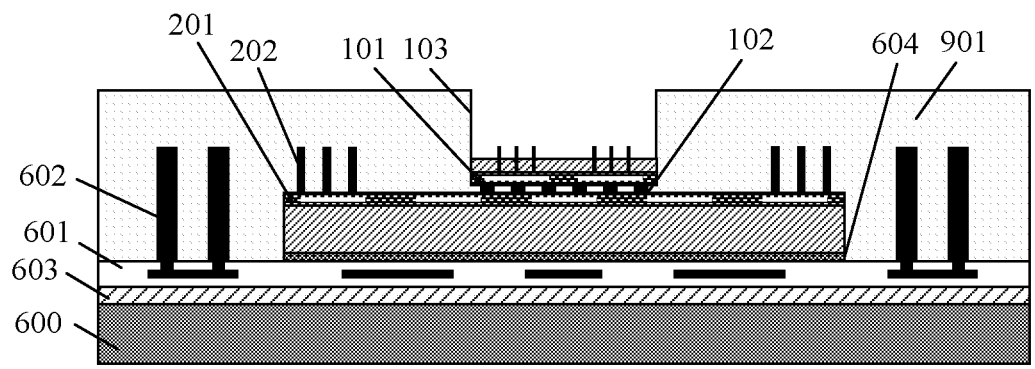

S73. Use the patterned first photoresist layer 901 as a mask, and remove a part of a material of the rear face of the first chip 12, to expose the first conductor pillar 103 with a preset length, thereby obtaining a structure shown in FIG. 9J.

Figure 9K:
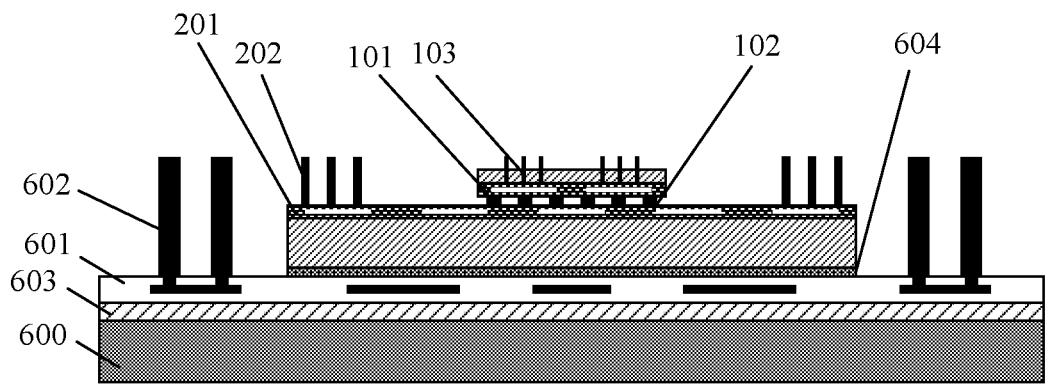

S74. Remove the patterned first photoresist layer 901, thereby obtaining a structure shown in FIG. 9K.

In another implementation of this embodiment of this application, after step S73 and before step S74, a dielectric layer may be formed on a surface that is of the first photoresist layer 901 and that is away from the second chip 20 and the rear face of the first chip 12. In step S74, when the first photoresist layer 901 is removed, the dielectric layer disposed on the surface of the first photoresist layer 901 falls off, so that only the dielectric layer disposed on the rear face of the first chip 12 is reserved to form the dielectric layer.

Figure 9L:
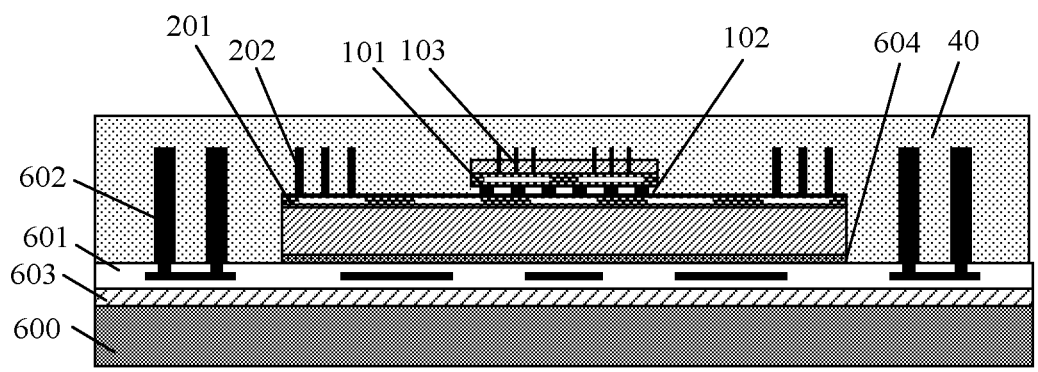

In this case, the implementation 2 of step S8 may specifically include the following steps:

S821. Form the plastic packaging layer 40 covering the carrier sheet 600, the second chip 20, and the first chip 12, thereby obtaining a structure shown in FIG. 9L.

Figure 9M:
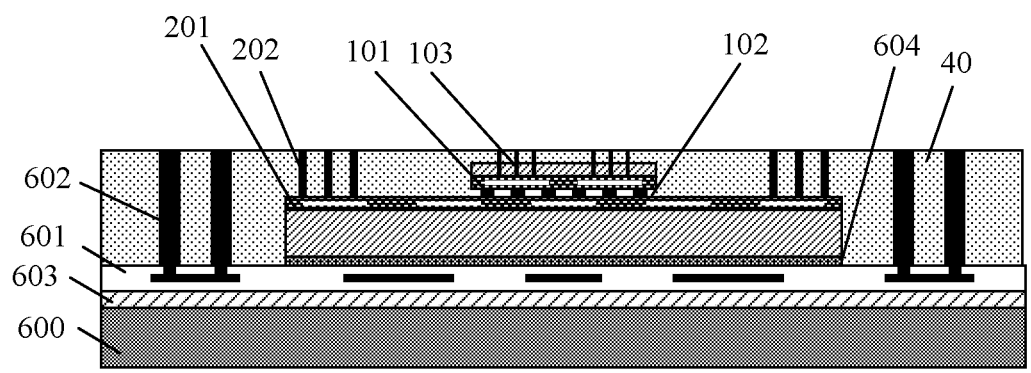

S822. Remove a part of the plastic packaging layer 40, to expose the end face that is of the first conductor pillar 103 and that is away from the second chip 20 and the end face that is of the second conductor pillar 202 and that is away from the second chip 20, thereby obtaining a structure shown in FIG. 9M.

It should be understood that the part of the plastic packaging layer 40 may be removed by using a grinding process and/or a polishing process. If the first redistribution layer 601 and the third conductor pillar 602 are included on the carrier sheet 600, the plastic packaging layer 40 is ground, and the end face that is of the third conductor pillar 602 and that is away from the first redistribution layer 601 further needs to be exposed.

In the implementation 2, a dielectric layer does not need to be formed. The plastic packaging layer is used to protect the rear face of the first chip from being ground, to reduce processes in the chip packaging, thereby further reducing the costs of the chip packaging.

Figure 9N:
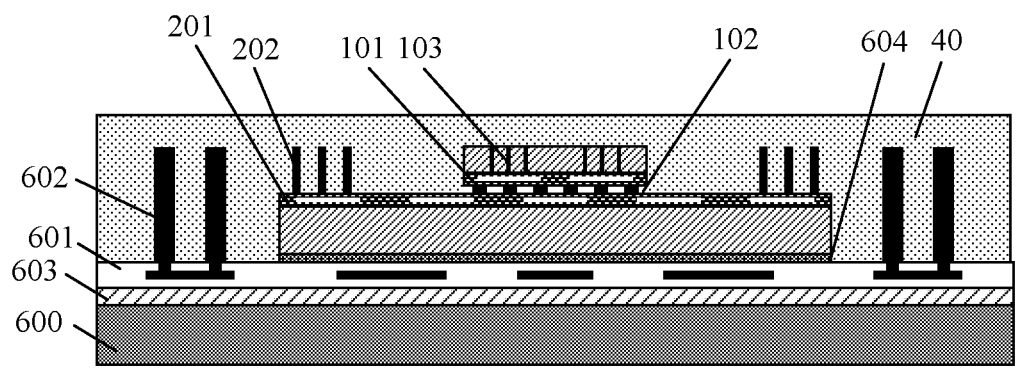
Figure 9O:
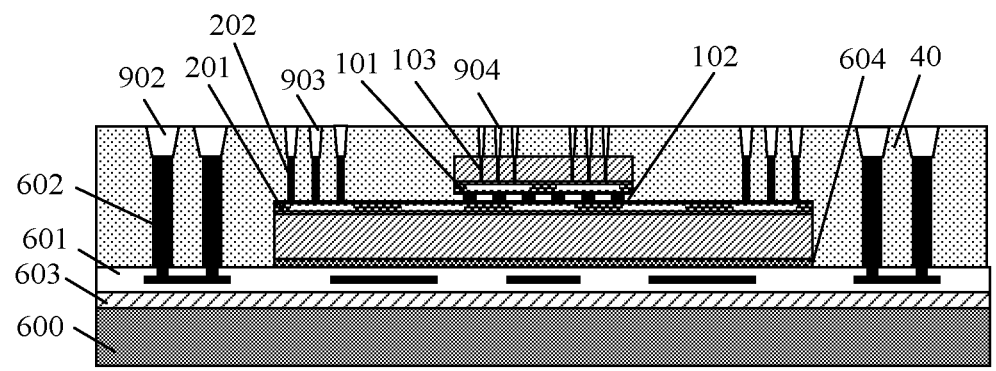

Implementation 3:

In an implementation 3, before step S8, the first chip is the first-type first chip 11, that is, one end of the first conductor pillar 103 is electrically connected to an internal circuit of the first chip 11, and the other end is exposed outside the rear face of the first chip 11. Further, this implementation may include the following steps:

S831. Form the plastic packaging layer 40 covering the carrier sheet 600, the second chip 20, and the first chip 11, thereby obtaining a structure shown in FIG. 9N.

The formed plastic packaging layer 40 may be a planarization layer.

S832. Dispose a first via 904 in a position of the plastic packaging layer 40 relative to the first conductor pillar 103, to expose the end face that is of the first conductor pillar 103 and that is away from the second chip 20, and dispose a second via 903 in a position of the plastic packaging layer 40 relative to the second conductor pillar 202, to expose the end face that is of the second conductor pillar 202 and that is away from the second chip 20, thereby obtaining a structure shown in FIG. 9O.

It should be understood that if the first redistribution layer 601 and the third conductor pillar 602 are included on the carrier sheet 600, a third via 902 further needs to be disposed in a position of the plastic packaging layer 40 relative to the third conductor pillar 602, to expose the end face that is of the third conductor pillar 602 and that is away from the first distribution layer 601.

When the implementation 3 is implemented, one end of the first conductor pillar in the first chip 11/12 needs to be prepared, to be exposed outside the rear face of the first chip 11/12. In this case, a packaging material does not need to be ground, to further reduce processes in the chip packaging, thereby further reducing the costs of the chip packaging.

S10. Connect a carrier board 30 to the end face that is of the first conductor pillar 103 and that is away from the first chip 11/12. It should be understood that, when the second conductor pillar 202 is disposed on the surface of the active layer 201 of the second chip 20, the carrier board 30 further needs to be connected to the end face that is of the second conductor pillar 202 and that is away from the second chip 20.

Optionally, the carrier board 30 is a second redistribution layer. A specific implementation of step S10 may be as follows: forming the second redistribution layer on the remaining plastic packaging layer, where the first conductor pillar 103 and the second conductor pillar 202 are separately connected to the second redistribution layer.

It should be understood that if the first redistribution layer 601 and the third conductor pillar 602 are included on the carrier sheet 600, the third conductor pillar 602 is electrically connected to the carrier board 30, to implement a coupling between the carrier board 30 and the first redistribution layer 601.

S12. Remove the carrier sheet 600, to obtain a chip package structure.

Optionally, after step S12, for the line carrier sheet 60, the method may further include the following step:

S14. Interconnect the third chip 80 to the first redistribution layer 601 by using the second interconnection structure 70.

For a specific implementation of the interconnection and a specific implementation of the interconnection in step S06, refer to the related description in step S06. Details are not described in this embodiment of this application.

It should be understood that the second interconnection structure 70 may include at least one solder ball, a pad, a metal bump, a metal pillar, and the like. This is not limited in this embodiment of this application.

It should be noted that, if the second chip 20 is directly bonded to the carrier sheet 600, the chip package structure shown in FIG. 3 may be obtained through the implementation 1 of step S8, step S10, and step S12.

If the second chip 20 is directly bonded to the carrier sheet 600, the chip package structure shown in FIG. 2 may be obtained through the implementation 2 of step S8, step S10, and step S12.

If the second chip 20 is directly bonded to the carrier sheet 600, the chip package structure shown in FIG. 4 may be obtained through the implementation 3 of step S8, step S10, and step S12.

If the second chip 20 is bonded to the first redistribution layer 601 on the carrier sheet 600, the chip package structure shown in FIG. 5 or FIG. 6 may be obtained through the implementation 1 of step S8, step S10, step S12, and step S14.

Likewise, if the second chip 20 is bonded to the first redistribution layer 601 on the carrier sheet 600, the chip package structure with another structure may be further obtained through any one of implementations of step S8, step S10, step S12, and step S14. Details are not described herein.

It should be noted that reference may be made to a material preparation method in the conventional technology for a method for preparing each layer structure. Details are not described in this embodiment of this application.

It should be further noted that a patterning process may include but is not limited to photolithography, a three-dimensional (3D) printing technology, silk-screen printing, and the like. The photolithography includes steps of forming a photoresist layer, exposing a part of the photoresist layer by using a mask, developing the to-be-patterned photoresist layer by using a developer solution, using the patterned photoresist layer as a mask, performing etching on a material disposed under the photoresist layer, and the like.

The etching process includes a dry etching process, a wet etching process, a reaction etching process, and the like. It should be understood that a proper etching process may be selected for an etched material and an environment in which the material is located.

Grinding, chemical mechanical planarization (CMP), or the like is a planarization process. A planarization layer structure may be obtained through grinding or polishing.

The interconnection structure such as the first interconnection structure 102, the second interconnection structure 70, or the third interconnection structure 50 may include at least one solder ball, at least one metal bump, or at least one metal pillar. This is not limited in this embodiment of this application. The interconnection method includes but is not limited to thermal compression bonding, eutectic bonding, embedded bump bonding, metal-metal direct bonding, hybrid bonding, and the like.

A material of the dielectric layer includes but is not limited to a polymer insulating material such as polyimide (PI), ploybenzoxazole (PBO), benzocyclobutene (BCB), or an epoxy molding compound (EMC), or an inorganic insulating material such as silicon nitride, silicon oxide, or silicon carbide.

The conductor pillar such as the first conductor pillar 103, the second conductor pillar 202, or the third conductor pillar 602 may be a metal pillar made of a metal material, for example, a copper pillar, an aluminum pillar, a silver pillar, or a palladium pillar, or may be a pillar made of another conductive material. This is not limited in this embodiment of this application. The conductor pillar is usually prepared by using a film coating method. A height of the conductor pillar can be accurately controlled.

A material of the plastic packaging layer 40 may be one of or a combination of an epoxy molding compound (EMC), polyethylene, polypropylene, polyolefin, polyamide, polyurethane, and the like. A molding process of the plastic packaging layer 40 may be dripping the low-viscosity plastic packaging layer 40 onto a surface of the carrier sheet 600 and a surface of the second chip 20, filling a gap between the chip and the carrier sheet 600 with the low-viscosity plastic packaging layer 40, wrapping the first chip 11/12 and the second chip 20, and after a thickness of the low-viscosity plastic packaging layer 40 reaches a preset thickness, heating and curing the low-viscosity plastic packaging layer 40 to form the plastic packaging layer 40.

Spin coating is a thin film forming process, and may be used to form the plastic packaging layer 40, the photoresist layer, and the like. A spin coating process usually includes three steps: material dispensing, high-speed rotating, and evaporating for film forming. A thickness of a formed film is controlled through controlling a time of photoresist coating, a rotation speed, a dripping volume, and a concentration and a viscosity of a used solution.

The dielectric layer 104 may be made of an organic insulating material such as epoxy resin or polyethylene, or may be an inorganic insulating material such as silicon nitride or silicon carbide. A preparation process of the dielectric layer 104 includes but is not limited to a thin film preparation process such as a physical vapor deposition technique or a chemical vapor deposition technique. A proper preparation process may be selected based on the material of the dielectric layer 104. Details are not described.

In this application, the redistribution layer such as the second redistribution layer or the first rerouting layer 601 may include at least one patterned conductive material layer and an insulating material layer for isolating the patterned conductive material. The conductive material may be a metal such as copper (Cu), silver (Ag), aluminum (Al), or another metal or metal alloy. The conductive material may be alternatively indium tin oxide (ITO), graphite, graphene, or the like. This is not limited in this embodiment of this application. The insulating material may be an inorganic insulating material, an organic insulating material, or the like. This is not limited in this embodiment of this application.

Figure 10:
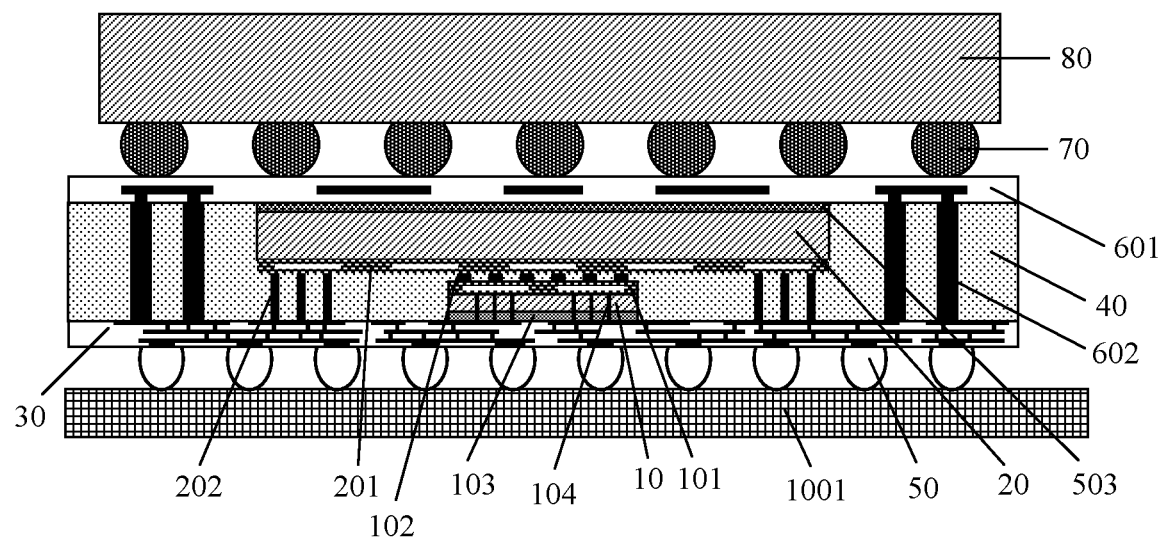
FIG. 10 is a schematic diagram of a structure of an integrated circuit according to an embodiment of this application.

The foregoing chip package structure or the chip package structure prepared by using the chip packaging method may be further applied to an integrated circuit. The integrated circuit includes a PCB and a chip package structure. The carrier board is coupled to the PCB in the chip package structure. The chip package structure is any chip package structure in the foregoing embodiments. FIG. 10 is a schematic diagram of a structure of an integrated circuit according to an embodiment of this application. FIG. 10 is described by using the chip package structure 500 shown in FIG. 5 as an example. The carrier board 30 in the chip package structure 500 is interconnected to a PCB 1001 by using the third interconnection structure 50, so that the PCB 1001 supplies power to the chip in the chip package structure 500 and a circuit in the PCB 1001 is connected to a circuit in the chip package structure 500. For a specific implementation of the chip package structure, refer to the related description in FIG. 2 to FIG. 7. Details are not described in this embodiment of this application.

In a specific implementation, a CPU, a memory, and the like may be integrated in the integrated circuit.

Figure 11:
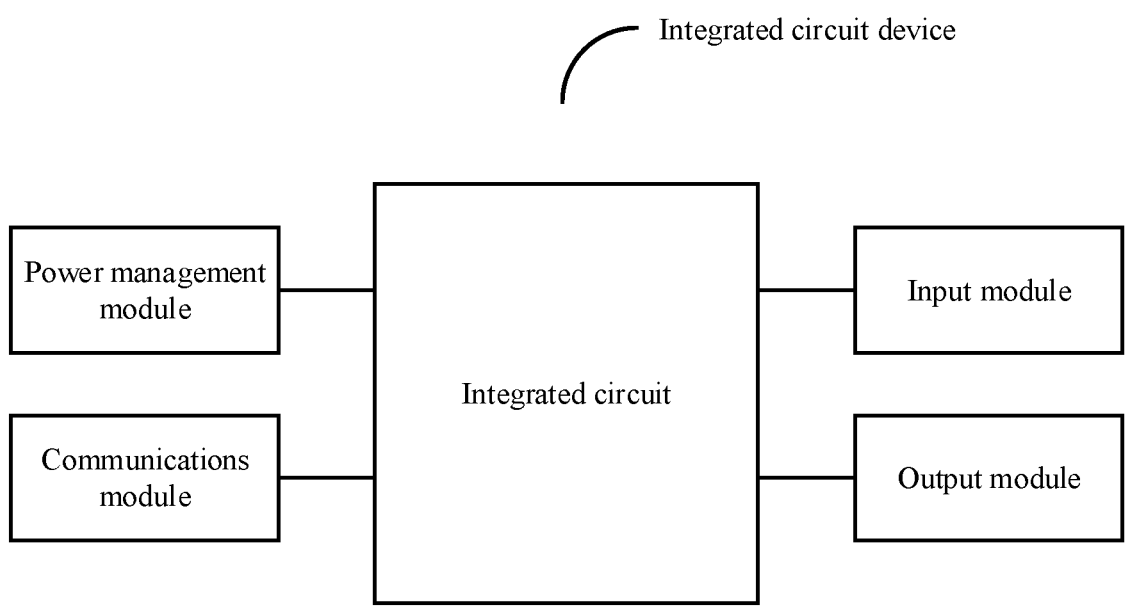
FIG. 11 is a schematic diagram of a structure of an integrated circuit device according to an embodiment of this application.

The foregoing chip package structure, or the chip package structure or the integrated circuit prepared by using the chip packaging method may be further applied to an integrated circuit device. FIG. 11 is a schematic diagram of a structure of an integrated circuit device according to an embodiment of this application. The integrated circuit device includes an integrated circuit 1101. The integrated circuit 1101 may be the integrated circuit shown in FIG. 10. For details, refer to the related description of the integrated circuit shown in FIG. 10. Details are not described in this embodiment of this application.

In a specific implementation, a CPU, a memory, and the like may be integrated in the integrated circuit 1101. Optionally, the integrated circuit device may further include a power management module 1102 configured to supply power to the integrated circuit 1101. Optionally, the integrated circuit device may further include a communications module 1103, an input module 1104, an output module 1105, and/or the like. The communications module 1103 is configured to implement a communication connection between the integrated circuit device and another device or the Internet. The input module 1104 is used by a user to enter information to the integrated circuit device. The input module 1104 may include a touch panel, a keyboard, a camera, and the like. The output module 1105 is used by the integrated circuit device to output information to the user. The output module 1105 may include a display panel and the like. It should be understood that the power management module 1102, the communications module 1103, the input module 1104, and/or the output module 1105 are not mandatory components of the integrated circuit device. The power management module 1102, the communications module 1103, the input module 1104, and/or the output module 1105 may also be integrated into the integrated circuit 1101, or may be separately disposed and coupled to the integrated circuit 1101. This is not limited in this embodiment of this application.

In this embodiment of this application, the integrated circuit device may be an electronic device including the integrated circuit 1101, for example, a smartphone, a tablet computer, a personal digital assistant, an electronic book, a computer, a server, a smart band, a virtual reality (VR) device, an augmented reality (AR) device, a digital television, and a set top box. It should be understood that the electronic devices listed herein are merely examples for description. This is not limited in this application.

Mutual reference may be made between different embodiments. For example, when technical details of an aspect are briefly described in an embodiment, refer to description in other embodiments.

It should be understood that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

It should be further understood that the foregoing embodiments of the chip packaging method may be executed by using a robot or a numerical control processing manner, and device software or a process configured to execute the chip packaging method may execute the foregoing chip packaging method by executing computer program code stored in a memory.

The foregoing description is merely a specific implementation of the present disclosure, but is not intended to limit the protection scope of the present disclosure. Any variation or replacement readily figured out by the person skilled in the art within the technical scope disclosed in the present disclosure shall fall within the protection scope of the present disclosure. Therefore, the protection scope of the present disclosure shall be subject to the protection scope of the claims.

What is claimed is:

1. A chip package structure comprising:
    a carrier board comprising a first circuit;
    a second chip comprising a second active layer;
    a first chip disposed between the second chip and the carrier board and comprising a first active layer, wherein the first active layer is opposite to the second active layer;
    a first interconnection structure disposed between the first chip and the second chip and configured to directly couple the first active layer to the second active layer, wherein the first interconnection structure is formed on a first surface of the first active layer or the second active layer;

a first conductor pillar disposed in the first chip and comprising:
   a first end coupled to the first active layer; and
   a second end passing through the first chip to couple to the first circuit; a second conductor pillar coupled to the second active layer and the first circuit; and
a dielectric insulating layer disposed on a second surface that is of the first chip and that is facing away from the second chip.

2. The chip package structure of claim 1, wherein the second conductor pillar comprises:
   a third end coupled to the second active layer; and
   a fourth end coupled to the first circuit.

3. The chip package structure of claim 1, wherein the first conductor pillar passes through the dielectric insulating layer.

4. The chip package structure of claim 1, further comprising a plastic packaging layer disposed between the carrier board and the second chip, wherein the first conductor pillar passes through the plastic packaging layer, and wherein the second conductor pillar passes through the plastic packaging layer.

5. The chip package structure of claim 1, wherein an end face that is of the first conductor pillar and that is facing away from the second chip and an end face that is of the second conductor pillar and that is facing away from the second chip are flush with each other.

6. The chip package structure of claim 1, wherein the first interconnection structure comprises at least one solder ball, at least one metal bump, or at least one metal pillar.

7. The chip package structure of claim 1, further comprising:
   a second interconnection structure;
   a first redistribution layer disposed on a surface that is of the second chip and that is facing away from the first chip, wherein the first redistribution layer comprises a second circuit;
   a third chip disposed on a surface that is of the first redistribution layer and that is facing away from the first chip, wherein the third chip is coupled to the first redistribution layer using the second interconnection structure; and
   a third conductor pillar comprising:
      a third end coupled to the first circuit; and
      a fourth end coupled to the second circuit.

8. The chip package structure of claim 7, wherein an end face that is of the first conductor pillar and that is facing away from the second chip, an end face that is of the second conductor pillar and that is facing away from the second chip, and an end face of the third conductor pillar are flush with each other.

9. The chip package structure of claim 1, further comprising a third interconnection structure disposed on a surface that is of the carrier board and that is facing away from the first chip, wherein the third interconnection structure is configured to couple the first circuit to a second circuit in a printed circuit board (PCB).

10. An integrated circuit comprising:
   a printed circuit board (PCB); and
   a chip package structure comprising:
      a carrier board coupled to the PCB and comprising a first circuit;
      a second chip comprising a second active layer;
      a first chip disposed between the second chip and the carrier board and comprising a first active layer, wherein the first active layer is opposite to the second active layer;
      a first interconnection structure disposed between the first chip and the second chip and configured to directly couple the first active layer to the second active layer, wherein the first interconnection structure is formed on a first surface of the first active layer or the second active layer;
      a first conductor pillar disposed in the first chip and comprising:
         a first end coupled to the first active layer; and
         a second end passing through the first chip to couple to the first circuit;
      a second conductor pillar coupled to the second active layer and the first circuit; and
      a dielectric insulating layer disposed on a second surface that is of the first chip and that is facing away from the second chip.

11. The integrated circuit of claim 10, wherein the second conductor pillar comprises:
   a third end coupled to the second active layer; and
   a fourth end coupled to the first circuit.

12. The integrated circuit of claim 10, wherein the first conductor pillar passes through the dielectric insulating layer.

13. The integrated circuit of claim 10, wherein the chip package structure further comprises a plastic packaging layer disposed between the carrier board and the second chip, wherein the first conductor pillar passes through the plastic packaging layer, and wherein the second conductor pillar passes through the plastic packaging layer.

14. The integrated circuit of claim 10, wherein an end face that is of the first conductor pillar and that is facing away from the second chip and an end face that is of the second conductor pillar and that is facing away from the second chip are flush with each other.

15. The integrated circuit of claim 10, wherein the first interconnection structure comprises a solder ball.

16. The integrated circuit of claim 10, wherein the first interconnection structure comprises a metal bump.

17. The integrated circuit of claim 10, wherein the first interconnection structure comprises one metal pillar.

18. The integrated circuit of claim 10, wherein the chip package structure further comprises:
   a second interconnection structure;
   a first redistribution layer disposed on a surface that is of the second chip and that is facing away from the first chip, wherein the first redistribution layer comprises a second circuit;
   a third chip disposed on a surface that is of the first redistribution layer and that is facing away from the first chip, wherein the third chip is coupled to the first redistribution layer using the second interconnection structure; and
   a third conductor pillar comprising:
      a third end coupled to the first circuit; and
      a fourth end coupled to the second circuit.

19. The integrated circuit of claim 18, wherein an end face that is of the first conductor pillar and that is facing away from the second chip, an end face that is of the second conductor pillar and that is facing away from the second chip, and an end face of the third conductor pillar are flush with each other.

20. The integrated circuit of claim 10, wherein the chip package structure further comprises a third interconnection structure disposed on a surface that is of the carrier board and that is facing away from the first chip, and wherein the third interconnection structure is configured to couple the first circuit to a second circuit in the PCB.

* * * * *